United States Patent
Wang et al.

(10) Patent No.: US 8,837,123 B2
(45) Date of Patent: Sep. 16, 2014

(54) METALLIC HOUSING, METHOD FOR MAKING THE SAME AND ELECTRONIC DEVICE USING THE SAME

(75) Inventors: Wei-Ting Wang, New Taipei (TW); Yu-Wen Chiu, New Taipei (TW); Chun-Lang Lee, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 341 days.

(21) Appl. No.: 13/158,611

(22) Filed: Jun. 13, 2011

(65) Prior Publication Data

US 2012/0275090 A1 Nov. 1, 2012

(30) Foreign Application Priority Data

Apr. 29, 2011 (CN) .......................... 2011 1 0110555

(51) Int. Cl.
*H05K 5/00* (2006.01)
*H05K 7/00* (2006.01)
*H05K 5/04* (2006.01)
*B23K 20/12* (2006.01)

(52) U.S. Cl.
CPC *H05K 5/04* (2013.01); *B23K 20/29* (2013.01); *B23K 20/1265* (2013.01)

USPC .................................................... 361/679.01

(58) Field of Classification Search
USPC .................... 361/679.01–679.02; 174/50–64; 29/592.1
See application file for complete search history.

(56) References Cited

U.S. PATENT DOCUMENTS

| | | | |
|---|---|---|---|
| 2007/0064403 A1* | 3/2007 | Badarinarayan et al. | 361/796 |
| 2009/0147175 A1* | 6/2009 | Tsumura et al. | 349/58 |
| 2011/0235281 A1* | 9/2011 | Mittleman | 361/728 |
| 2012/0134078 A1* | 5/2012 | Wang et al. | 361/679.01 |
| 2013/0037602 A1* | 2/2013 | Wang et al. | 228/114 |

* cited by examiner

*Primary Examiner* — Bernard Rojas
(74) *Attorney, Agent, or Firm* — Novak Druce Connolly Bove + Quigg LLP

(57) ABSTRACT

A metallic housing for an electronic device, the metallic housing includes a main body defining a receiving chamber for receiving electronic components and an opening communicating with the receiving chamber, and a covering plate positioned on the main body adjacent to a side of the main body. The covering plate is welded to the main body by friction stir welding and a welded region is formed on a side surface of the metallic housing such that the welded region is smooth with the main body and the covering plate. A method for making the metallic housing and an electronic device using the metallic housing is also disclosed.

4 Claims, 4 Drawing Sheets

METALLIC HOUSING, METHOD FOR MAKING THE SAME AND ELECTRONIC DEVICE USING THE SAME

BACKGROUND

1. Technical Field

The present disclosure relates to a metallic housing, method for making the same and electronic device using the same.

2. Description of Related Art

Electronic devices may have metallic housings. Some metallic housings cannot be formed by one-shot injection molding technology due to structural limitations in the housing design. One type of metallic housing comes in two parts fixed together using screws or rivets, which does not present a pleasing appearance. Another type of metallic housing also comes in two parts but are fixed together using latches integrated with each part. Although the latter type has a better appearance, metallic housings with latches are not as strong and easily damaged when accidentally dropped.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the metallic housing, method for making the same and electronic device using the same. Moreover, in the drawings like reference numerals designate corresponding parts throughout the several views. Wherever possible, the same reference numerals are used throughout the drawings to refer to the same or like elements of an embodiment.

DETAILED DESCRIPTION

Figure 1:
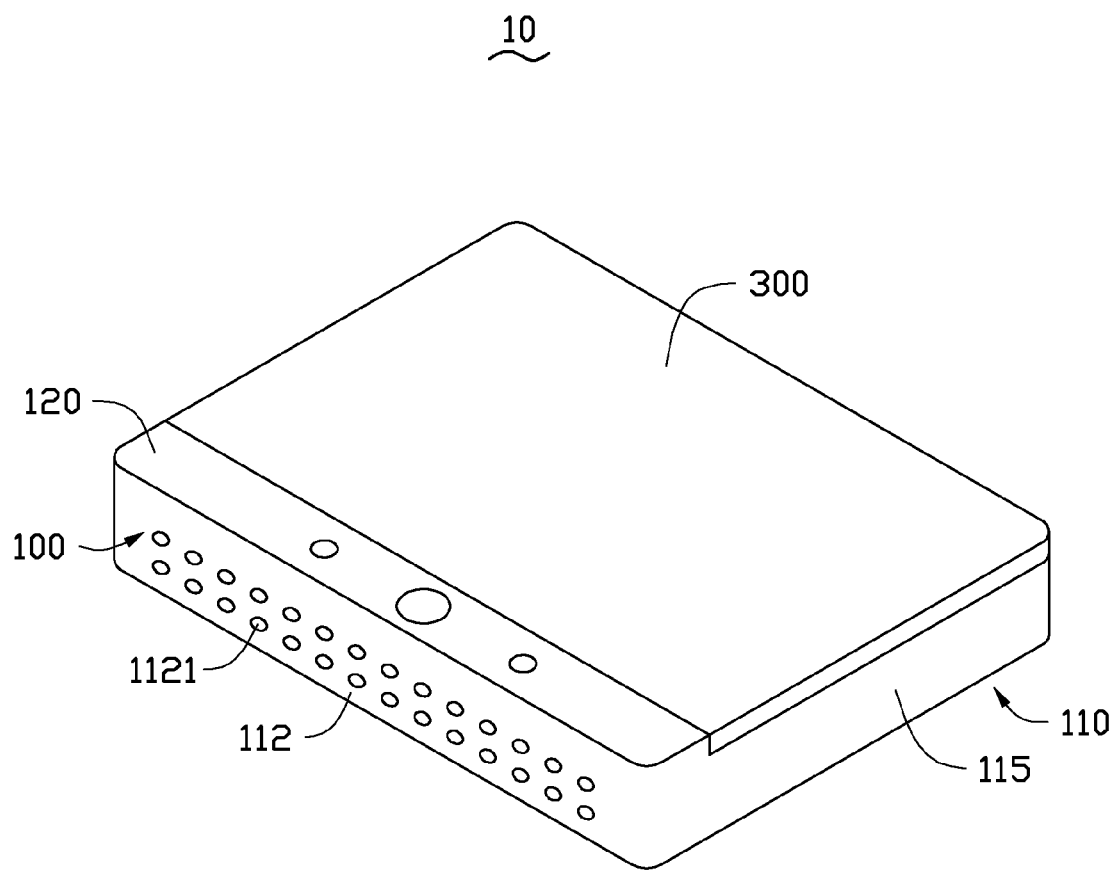
FIG. 1 is a schematic, isometric view of an embodiment of an electronic device.
Figure 2:
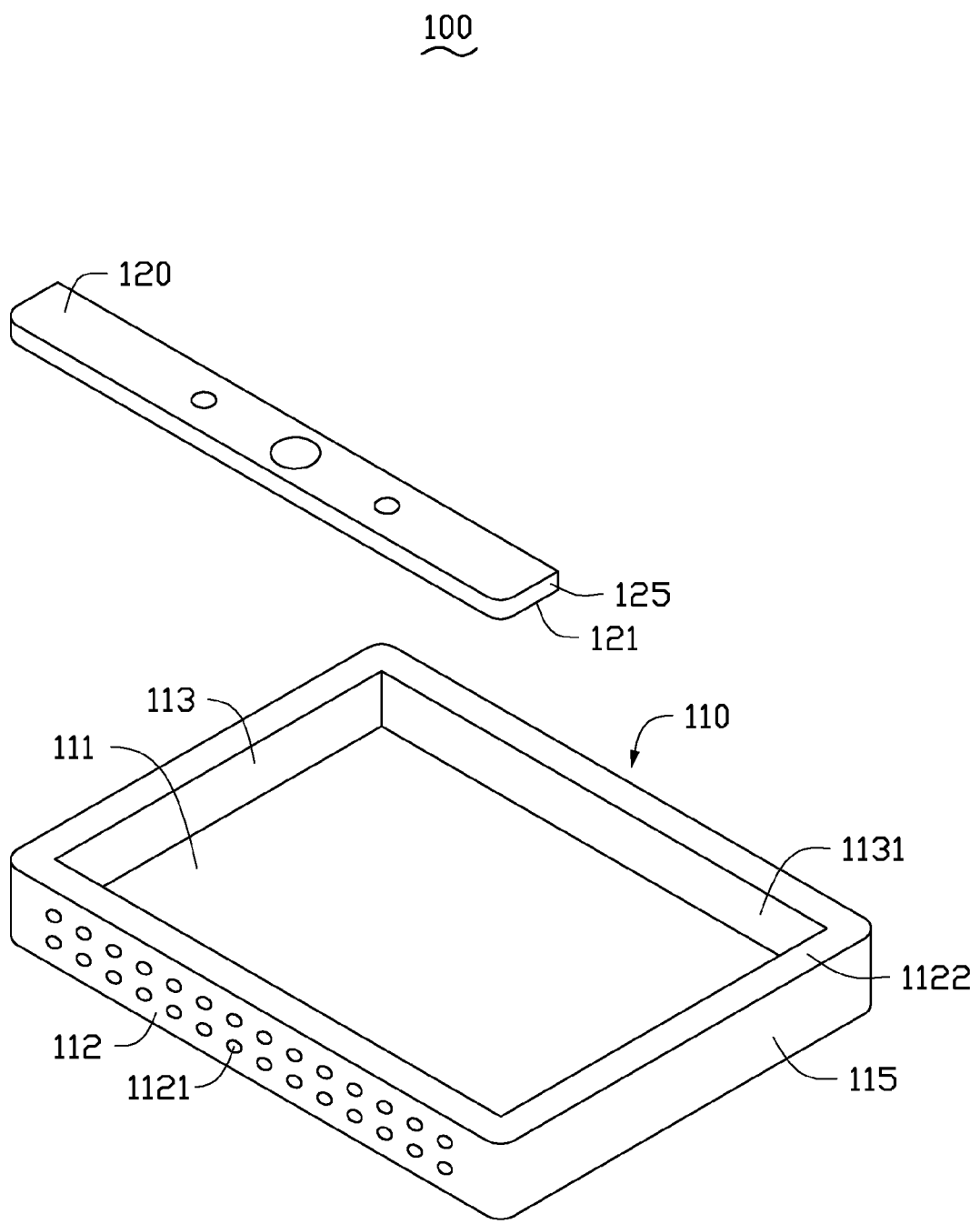
FIG. 2 is an exploded, isometric view of an embodiment of a metallic housing prepared for joining.

Referring to FIGS. 1 and 2, an embodiment of an electronic device 10 includes a metallic housing 100, a display panel 300 fixed to the housing 100, a plurality of electronic components (not shown) received within the housing 100. In one embodiment, the device 10 is a desktop computer.

The housing 100 includes a main body 110 and a covering plate 120 positioned on the main body 110 to shield a portion of the main body 110. The covering plate 120 can be joined to the main body 110 by friction stir welding. The main body 110 and the covering plate 120 cooperatively form a joint line 140 between sidewalls 112 of the main body 110 and the covering plate 120. In one embodiment, the main body 110 is a rear frame used for fixing a display panel 300. In the illustrated embodiment, the covering plate 120 is a substantially rectangular plate located adjacent to one side of the main body 110 and resists a sidewall of the display panel 300. A plurality of keypads (not labeled) may be fixed to the covering plate 120.

The main body 110 further includes a bottom plate 111. The plurality of sidewalls 112 extend from the edge of the bottom plate 111. The bottom plate 111 and the sidewalls 112 cooperatively define a receiving chamber 113. The main body 110 defines an opening 1131 communicating with the receiving chamber 113.

In one embodiment, the bottom plate 111 and the sidewalls 112 are integrated and formed by punching. The sidewalls 112 are substantially perpendicular to the bottom plate 111. The number of the sidewalls 112 is four. One of the sidewalls 112 defines a plurality of cooling holes 1121. Each sidewall 112 includes an outer sidewall surface 115 positioned outside of the receiving chamber 113 and an upper surface (not labeled) substantially parallel to and spaced apart from the bottom plate 111. The upper surfaces of the sidewalls 112 cooperatively form a support surface 1122. The support surface 1122 is substantially rectangular and annular in shape.

The covering plate 120 includes an abutting surface 121 corresponding to the support surface 1122. The abutting surface 121 abuts against the support surface 1122 to enable the covering plate 120 to be located at the upper surface of the housing 100 and shield a portion of the receiving chamber 113.

The covering plate 120 further includes a plurality of side surfaces 125 corresponding to the outer sidewall surfaces 115. In one embodiment, the main body 110 and the covering plate 120 are made of an aluminium alloy.

It is to be understood that the sidewalls 112 may also extend from the edge and the middle of the bottom plate 111 and cooperatively form a plurality of receiving chambers 113, with each receiving chamber 113 having an opening 1131 facing the upper surface of the housing 100. Electronic components (not shown) may be received within the receiving chambers 113.

Figure 3:
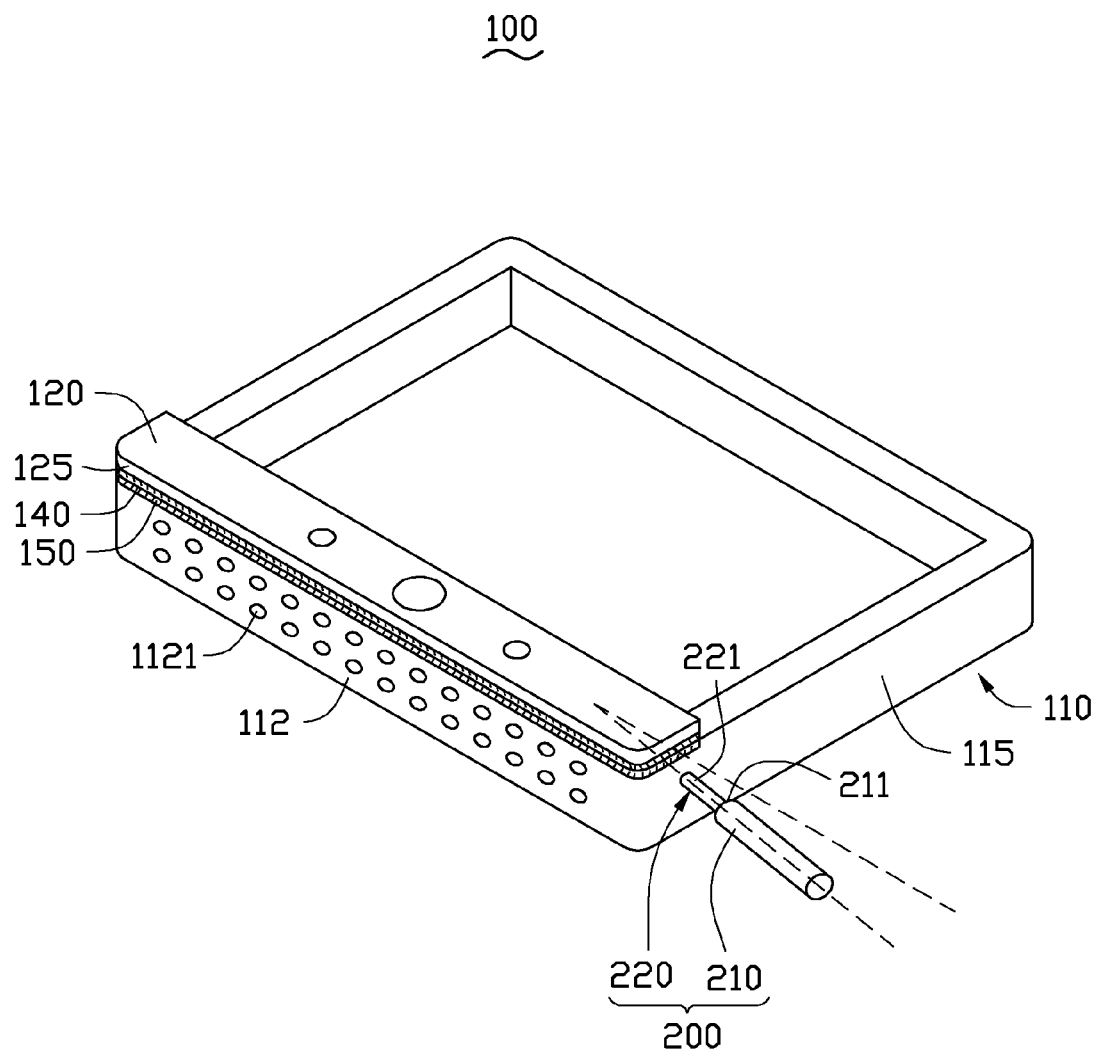
FIG. 3 is a schematic, isometric view of the metallic housing of FIG. 2 friction stir welding.
Figure 4:
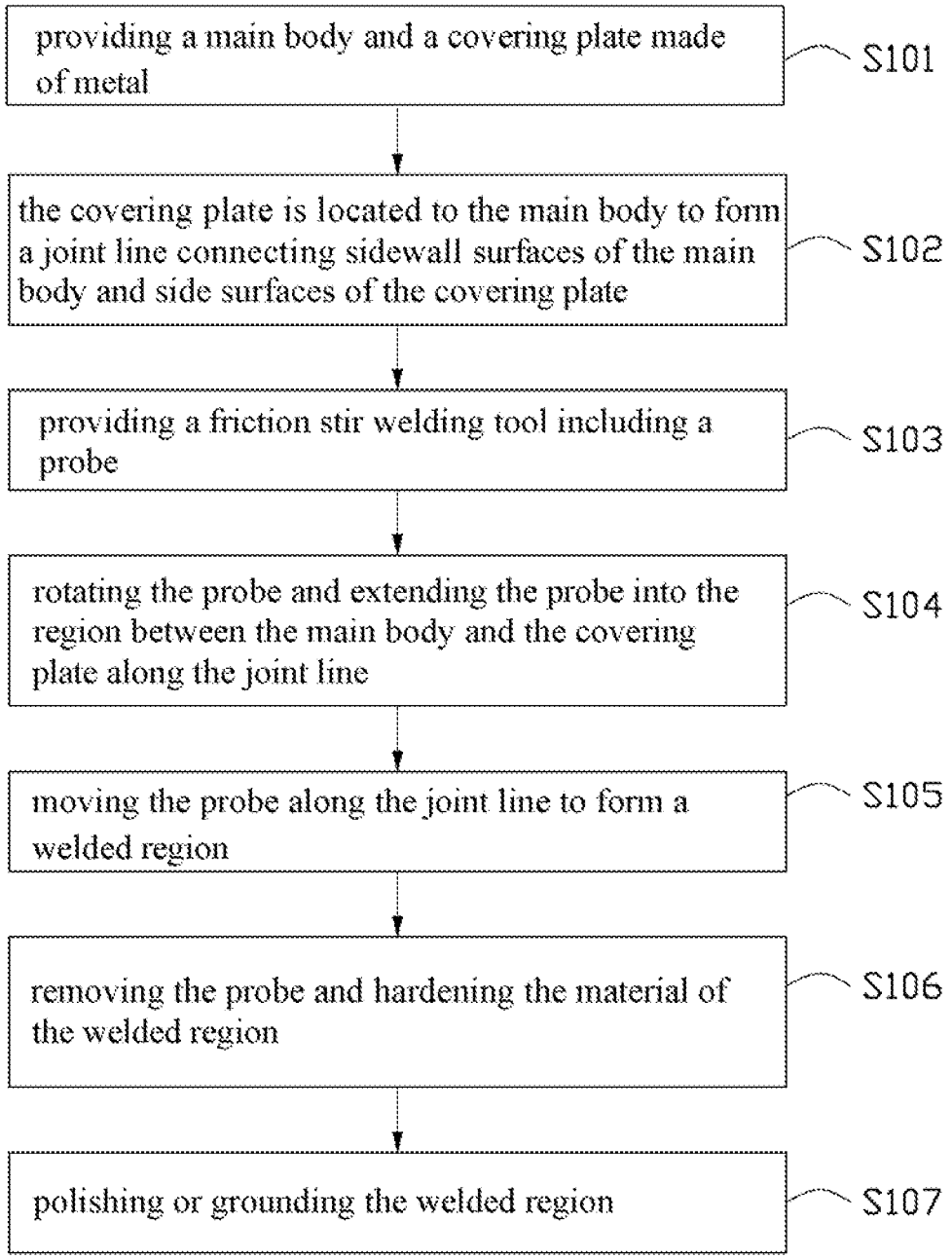
FIG. 4 is a flow chart of an embodiment of a method for making the metallic housing of FIG. 2.

Referring to the FIGS. 3 and 4, a method for making the housing 100 follows.

In step S101, a main body 110 and a covering plate 120 made of metal are provided. In one embodiment, the metal is an aluminum alloy.

In step S102, the covering plate 120 is located to the main body 110 to form a joint line 140 connecting the outer sidewall surfaces 115 to the side surfaces 125. The abutting surface 121 is aligned to the support surface 1122 and then the covering plate 120 abuts against the main body 110 to shield a portion of the opening 1131. Each side surface 125 can be coplanar with a corresponding outer sidewall surface 115. A welding region 150 is defined along the joint line 140 at the outer sidewall surfaces 115 and the side surfaces 125. In one embodiment, the welding region 150 is a strip-shaped region.

In step S103, a friction stir welding tool 200 including a probe 220 is provided. The friction stir welding tool 200 further includes a driver (not shown) and a shoulder 210 driven by the driver. The probe 220 is fixed to the distal end of the shoulder 210 away from the driver and includes a cylindrical surface 221. The shoulder 210 and the probe 220 are aligned along a common axis and cooperatively form a stepped shaft. The shoulder 210 includes an end surface 211 facing the probe 220.

In step S104, the probe 220 is rotated and extended into the region between the main body 110 and the covering plate 120 along the joint line 140, whereby frictional heat is generated to cause the material of the welding region 150 to soften. For example, the probe 220 moves close to the welding region 150. The shoulder 210 drives the probe 220 to rotate. The probe 220 rotates at a predetermined speed according to the material of the main body 110 and the covering plate 120 sufficient to joint weld the main body 110 to the covering plate 120. In one embodiment, the rotation of the probe 220 varies from about 2700 rotations per minute (rpm) to about 3000 rpm. The probe 220 is extended into a joint of the main body 110 and the covering plate 120, for example, at a speed between about 20 millimeters per minute (mm/min) to about 40 mm/min, until the end surface 211 of the shoulder 210 abuts against the welding region 150. Frictional heat is generated between the abutting surface 121 and the support surface 1122 by rotation of the cylindrical surface 221 against the surfaces 121,1122. The material of the welding region 150 then softens and becomes pliant as the result of the frictional heat.

In step S105, the probe 220 is moved along a tangent line of the joint line 150 to form a welded region. The velocity of the movement varies from about 40 mm/min to about 600 mm/min.

In one embodiment, the axis of the probe 220 is located in a plane defined by the tangent line of the joint line 140 and the normal line of the outer sidewall surfaces 115. The axis of the probe 220 and the normal direction of the outer sidewall surfaces 115 define an angle. In one embodiment, the angle is about 5 degrees. The axis of the probe 220 is oblique to the moving direction.

In step S106, the probe 220 is removed from the welded region, and a hardening process is applied to the welded region to allow the material of the welded region to harden. In one embodiment, the welded region of the housing 100 is allowed to cool and harden naturally. It is to be understood that the welded region may be cooled by a gas such as air or a liquid such as water.

In step S107, the welded region of the housing 100 is polished or ground to smoothen the joint. Thus, the process of making the housing 100 is completed.

It is to be understood that the step S107 may be omitted if the welded region of the housing 100 is satisfactory in appearance.

It is to be understood that the method for making the housing 100 may further include a sand blasting process and an anodic oxidation process applied to the housing 100 after the step S107 to obtain a housing 100 having a better appearance.

The covering plate 120 is fixed to the main body 110 firmly by friction stir welding to form an integral housing 100 having a good appearance and high strength. The welded region is located on the side surfaces of the housing 100, thus, any color differences between the welded region and other regions of the housing 100 after anodic oxidation will not affect the appearance of the housing 100.

It is to be understood that the present disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, the electronic device comprising:
a metallic housing comprising:
a main body defining a receiving chamber and an opening communicating with the receiving chamber; and
a covering plate positioned on the main body adjacent to a side of the main body, the covering plate being welded to the main body by friction stir welding, thereby forming a welded region on a side surface of the metallic housing, such that the welded region is smooth with the main body and the covering plate;
a display panel positioned adjacent to the covering plate and fixed to the main body of the metallic housing, the covering plate being combined to an edge of the display panel without overlapping the display panel, the display panel and the covering plate cooperatively covering the opening, thereby sealing the receiving chamber, and a top surface of the display panel being coplanar to a top surface of the covering plate; and
a plurality of electronic components received in the receiving chamber.

2. The electronic device of claim 1, wherein the main body comprises a bottom plate and a plurality of sidewalls extending from the edge of the bottom plate, the bottom plate and the sidewalls cooperatively define the receiving chamber.

3. The electronic device of claim 2, wherein each sidewall comprises an outer sidewall surface positioned outside of the receiving chamber, the covering plate comprises a plurality of side surfaces, with each side surface being continuous with a corresponding outer sidewall surface.

4. The electronic device of claim 2, wherein the main body comprises a support surface surrounding the receiving chamber, the covering plate comprises an abutting surface, the covering plate is located on the main body, the abutting surface of the covering plate is aligned to the support surface of the main body.

* * * * *